(12) United States Patent
Pathak et al.

(10) Patent No.: US 12,183,553 B2
(45) Date of Patent: Dec. 31, 2024

(54) BAFFLE IMPLEMENTATION FOR IMPROVING BOTTOM PURGE GAS FLOW UNIFORMITY

(71) Applicant: Applied Materials, Inc., Santa Clara, CA (US)

(72) Inventors: Nitin Pathak, Mumbai (IN); Kartik Shah, Saratoga, CA (US); Amit Kumar Bansal, Milpitas, CA (US); Tuan Anh Nguyen, San Jose, CA (US); Juan Carlos Rocha, San Carlos, CA (US); David Blahnik, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 896 days.

(21) Appl. No.: 16/891,626

(22) Filed: Jun. 3, 2020

(65) Prior Publication Data
US 2020/0388470 A1 Dec. 10, 2020

(30) Foreign Application Priority Data
Jun. 6, 2019 (IN) .............................. 201941022440

(51) Int. Cl.
*H01J 37/32* (2006.01)
(52) U.S. Cl.
CPC .... *H01J 37/32633* (2013.01); *H01J 37/3244* (2013.01); *H01J 37/32458* (2013.01)
(58) Field of Classification Search
CPC ............ C23C 16/4408; C23C 16/4409; C23C 16/45519; C23C 16/45521;
(Continued)

(56) References Cited

U.S. PATENT DOCUMENTS 5,711,815 A * 1/1998 Lee .................. C23C 16/45521
118/728
5,883,017 A * 3/1999 Tepman ............ H01L 21/67751
438/800

(Continued)

FOREIGN PATENT DOCUMENTS

CN 101235482 A 8/2008
JP H05166734 A 7/1993

(Continued)

OTHER PUBLICATIONS

International Search Report and Written Opinion for PCT/US2020/035764 dated Sep. 3, 2020.

(Continued)

*Primary Examiner* — Benjamin Kendall
(74) *Attorney, Agent, or Firm* — Patterson + Sheridan, LLP

(57) ABSTRACT

The present disclosure generally relates to an apparatus for improving azimuthal uniformity of a pressure profile of a processing gas. In one example, a processing chamber includes a lid, sidewalls, and a substrate support defining a processing volume. A bottom bowl, a chamber base, and a wall define a purge volume. The purge volume is disposed beneath the processing volume. The bottom bowl includes a first surface having a first equalizer hole. A passage couples the processing volume to the purge volume via the first equalizer hole and an inlet. The passage is positioned above the first equalizer hole. The chamber base has a purge port coupleable to a purge gas line for supplying a purge gas to the purge volume. A baffle is disposed in the purge volume at a height above the purge port, and is configured to deflect a trajectory of the purge gas.

14 Claims, 9 Drawing Sheets

(58) Field of Classification Search
CPC .......... C23C 16/45591; H01J 37/32091; H01J 37/3244; H01J 37/32449; H01J 37/32458; H01J 37/32513; H01J 37/32633; H01J 37/32871

See application file for complete search history.

(56) References Cited

U.S. PATENT DOCUMENTS

| | | | |
|---|---|---|---|
| 5,938,850 A * | 8/1999 | Arami | H01L 21/67115 |
| | | | 118/724 |
| 6,013,319 A | 1/2000 | Dietze | |
| 2003/0198754 A1* | 10/2003 | Xi | C23C 16/45512 |
| | | | 156/345.33 |
| 2004/0071897 A1* | 4/2004 | Verplancken | C23C 16/452 |
| | | | 427/248.1 |
| 2011/0308464 A1 | 12/2011 | Kudoh et al. | |
| 2011/0312187 A1 | 12/2011 | Suzuki et al. | |
| 2016/0002776 A1 | 1/2016 | Nal et al. | |
| 2016/0002788 A1 | 1/2016 | Nal et al. | |
| 2018/0261453 A1 | 9/2018 | Ghosh et al. | |
| 2019/0017168 A1* | 1/2019 | Takagi | H01L 21/67126 |

FOREIGN PATENT DOCUMENTS

| | | |
|---|---|---|
| JP | H1136076 A | 2/1999 |
| JP | 2009041111 A | 2/2009 |
| JP | 2017224850 A | 12/2017 |
| KR | 20010113315 A | 12/2001 |
| KR | 20070069122 A | 7/2007 |
| TW | 200842092 A | 11/2008 |
| TW | 201539626 A | 10/2015 |
| WO | 2015146362 A1 | 10/2015 |

OTHER PUBLICATIONS

Chinese Application No. 202080041335.1, Office Action dated Nov. 30, 2023, 22 pages.

Taiwan Office Action dated Jan. 24, 2024 for Application No. 109118955.

Taiwan Office Action dated Jun. 3, 2024 for Application No. 109118955.

Japanese Office Action dated May 28, 2024 for Application No. 2021-572000.

* cited by examiner

BAFFLE IMPLEMENTATION FOR IMPROVING BOTTOM PURGE GAS FLOW UNIFORMITY

CROSS-REFERENCE TO RELATED APPLICATIONS

This application claims benefit of Indian Provisional Application Serial No. 201941022440, filed Jun. 6, 2019, all of which is incorporated herein by reference in its entirety.

BACKGROUND

Field of Endeavor

Examples described herein generally relate to a substrate processing apparatus, more specifically to an apparatus for improving the processing uniformity of a substrate in the substrate processing apparatus.

DETAILED DESCRIPTION

Description of the Related Art

Deposition processes, such as chemical vapor deposition (CVD) and plasma enhanced CVD (PECVD) processes are commonly used in semiconductor device manufacturing. During semiconductor device manufacturing, material is deposited in layers on a substrate surface by reacting one or more gaseous precursors in a processing volume of the processing chamber to form a layer of material on the substrate surface. Gaseous precursors can include one or both of gas-phase precursors and vapor-phase precursors.

Residue materials, such as gaseous precursors and their reaction byproducts, can undesirably deposit material on one or more interior surfaces in the processing volume of the processing chamber. The thickness of the deposits can increase with every substrate processed. As the thickness of the residual material deposits grow, the deposits eventually flake from the processing chamber surfaces leading to undesirable particulate contamination in the processing volume. The particulate contamination can negatively affect the quality of the material layer deposited on the substrate. Therefore, CVD and PECVD processing chambers must be periodically cleaned to remove residue material therefrom. Process chamber cleaning includes one or both of periodic cleaning cycles between substrate processing operations and opening the chamber for cleaning and scheduled maintenance. Such cleaning and maintenance result in lower substrate throughput and increased chamber downtime. As such, this cleaning and maintenance can cause lost production capacity of the processing chamber.

Accordingly, there is a need in the art for apparatus to prevent undesirable deposition on the interior surfaces in the processing volume of the processing chamber.

SUMMARY

Disclosed herein is a baffle for a purge gas volume of a plasma processing chamber. The processing chamber includes a lid, sidewalls, and a substrate support that collectively define a processing volume. A bottom bowl, a chamber base, and a wall coupled to the chamber base and the bottom bowl collectively define a purge volume. The purge volume is disposed beneath the processing volume. The bottom bowl includes a first surface having a first equalizer hole disposed therethrough. A passage couples the processing volume to the purge volume via the first equalizer hole and an inlet. The passage is positioned above the first equalizer hole. The chamber base has a purge port coupleable to a purge gas line for supplying a purge gas to the purge volume via the purge port. A baffle is disposed in the purge volume at a height above the purge port. The baffle is configured to deflect a trajectory of the purge gas entering the purge volume.

In another example, a processing chamber includes a lid, sidewalls, and a substrate support that collectively define a processing volume. A bottom bowl, a chamber base, and a wall coupled to the chamber base and the bottom bowl collectively define a purge volume. The purge volume is disposed beneath the processing volume. The bottom bowl includes a first surface having a first equalizer hole disposed therethrough. A passage couples the processing volume to the purge volume via the first equalizer hole and an inlet. The passage is positioned above the first equalizer hole. The chamber base has a first purge port coupleable to a first purge gas line for supplying a purge gas to the purge volume via the purge port. The chamber base has a second purge port coupleable to a second purge gas line for supplying the purge gas to the purge volume via the second purge port. A baffle is disposed in the purge volume at a height above the first purge port and the second purge port.

In yet another example, a processing chamber includes a lid, sidewalls, and a substrate support that collectively defining a processing volume. A bottom bowl, a chamber base, and a wall coupled to the chamber base and the bottom bowl collectively define a purge volume. The purge volume is disposed beneath the processing volume. The bottom bowl includes a first surface having a first equalizer hole disposed therethrough. A passage couples the processing volume to the purge volume via the first equalizer hole and an inlet. The passage is positioned above the first equalizer hole. The chamber base has a purge port coupleable to a purge gas line for supplying a purge gas to the purge volume via the purge port. A baffle is disposed in the purge volume at a height above the purge port. The baffle is configured to deflect a trajectory of the purge gas entering the purge volume. The baffle is configured to reduce a velocity of the purge gas at the first equalizer hole to less than 20 percent of the velocity of a purge gas jet at the purge port.

BRIEF DESCRIPTION OF THE DRAWING

So that the above recited features of the present disclosure can be understood in detail, a more particular description of the disclosure, briefly summarized above, may be had by reference to examples herein, some of which are illustrated in the appended drawings. However, it is to be noted that the appended drawings illustrate only examples and are therefore not to be considered limiting of the disclosure's scope. Accordingly, the appending drawings admit to other equally effective examples.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Examples disclosed herein generally relate to a flow deflecting apparatus that interrupts a jet of purge gases in a purge gas volume. Advantageously, interrupting a jet of purge gas influences the average mass flow rate of the purge gas at an equalizer hole(s). The equalizer hole couples the purge gas volume to a processing volume via a passage. The mass flow rate of the purge gas at the equalizer hole corresponds to the mass flow rate of a processing gas that enters the processing volume at an inlet. Stated differently, the mass flow rate of the purge gas in the purge gas volume is proportional to the mass flow rate of the purge gas at the inlet, i.e. an area where the processing volume couples to a purge gas volume. The velocity of the processing gas at the inlet of the passage influences the azimuthal pressure profile and mass flow uniformity of the plasma across a substrate in the processing volume. Similarly, the momentum of the processing gas at the inlet of the passage influences the azimuthal pressure profile and mass flow uniformity of the plasma across the substrate within the processing volume.

Deposition uniformity on the substrate corresponds to the mass flow uniformity and the pressure profile around the substrate. The uniformity of flow and pressure profile correlates to individual uniformity levels of the processing gasses, and the mass flow uniformity of the purge gas(es). Advantageously, disposing the baffle in the purge volume, greatly improves the mass flow uniformity of purge gas when the purge gas interacts with the processing gasses at the inlet that couples the purge volume and processing volume. Accordingly, a highly uniform pressure and flow profile around substrate is provided. As such, increasing uniformity of flow in the purge volume decreases unwanted deposition of materials on internal walls of the processing chamber, which reduces cleaning frequency of the processing chamber and decreases processing chamber downtime.

Examples herein are illustratively described below in reference to use in a system configured to etch substrates. It should be noted however that the disclosed subject matter has utility in other system configurations such as chemical vapor deposition systems, physical vapor deposition systems, and other systems in which a purge gas is introduced into the internal volume of the plasma processing chamber. It should also be understood that examples disclosed herein may be adapted for practice in other process chambers that are configured to process substrates of various dimensions.

Figure 1:
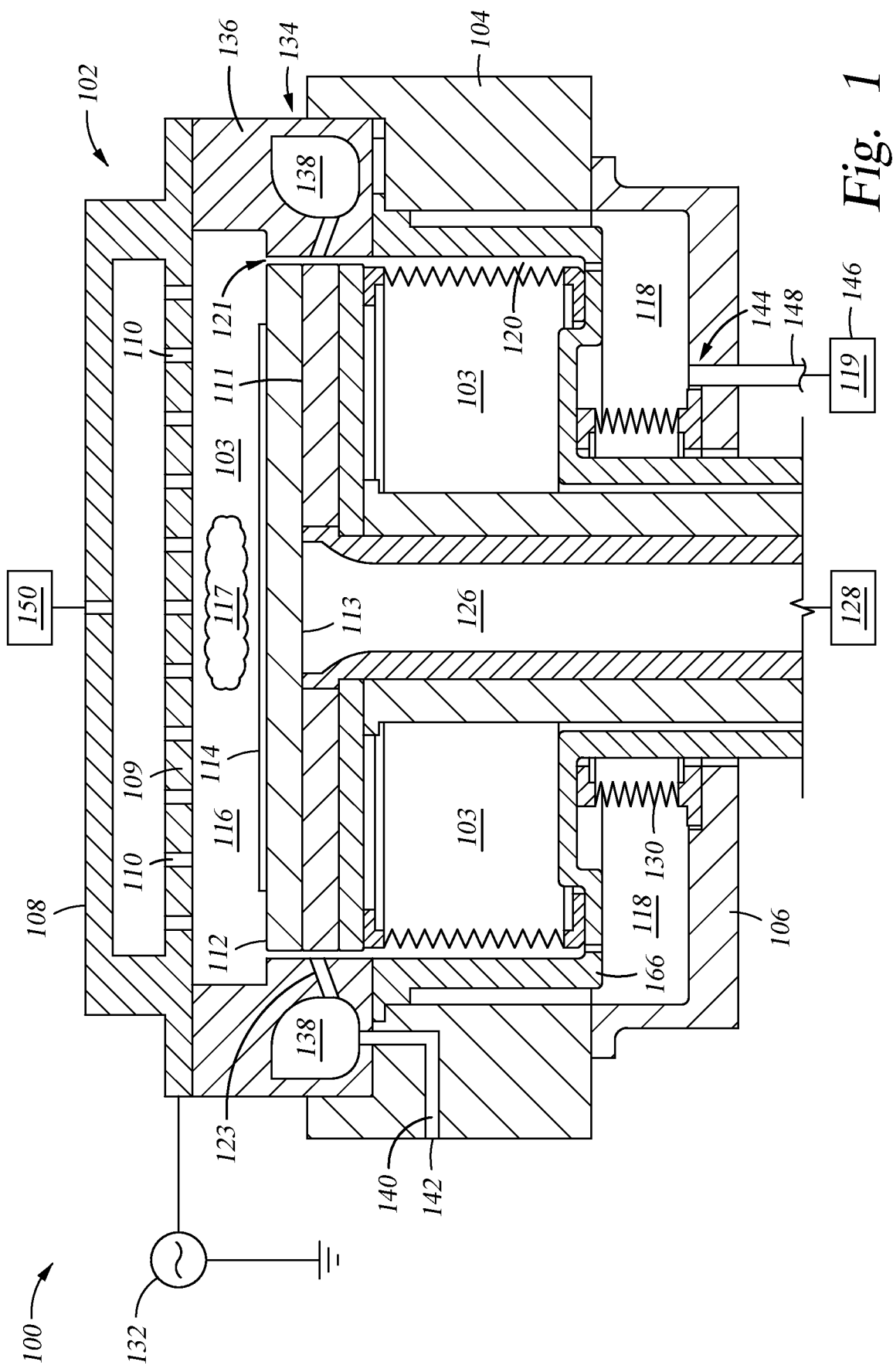
FIG. 1 is a schematic cross-sectional view of an exemplary processing chamber 100, according to one example.

FIG. 1 is a schematic sectional view of an exemplary processing chamber 100, according to one example. The processing chamber 100 includes a chamber body 102 having one or more sidewalls 104, a chamber base 106, and a chamber lid assembly 108. An internal volume 103 is defined by the chamber body 102, sidewalls 104, chamber base 106, and chamber lid assembly 108. A substrate support 111 is disposed in the internal volume 103. The internal volume 103 includes a processing volume 116 and a purge volume 118. The processing volume 116 is defined by the inner surface of the sidewalls 104, the inner surface of the chamber lid assembly 108, and a first surface 112 of the substrate support 111. The purge volume 118 is defined by the sidewalls 104, chamber base 106, bellows 130, and a bottom bowl 166.

Herein, the chamber lid assembly 108 is electrically isolated from the sidewalls 104. A showerhead 109 is disposed in the chamber lid assembly 108 and coupled thereto. The showerhead 109 has a plurality of openings 110 disposed therethrough. The plurality of openings 110 uniformly distribute one or more processing gases 117 from a processing gas source 150 into the processing volume 116. Herein, the showerhead 109 is formed of an electrically conductive material. The showerhead 109 is also coupled to a first power supply 132, such as an RF power supply. The first power supply 132 provides power to ignite and maintain the plasma of the processing gases through capacitive coupling therewith.

The substrate support 111 is positioned in the internal volume 103. A support shaft 126 is coupled to a lift actuator 128 which raises and lowers the support shaft 126. The substrate support 111 is coupled to the support shaft 126. The lift actuator 128 is configured to move the substrate support 111 between a lowered position and a raised position. The raised or lowered position can facilitate transfer of a substrate 114 to and from the internal volume 103. A height of the substrate support 111 is determined in correlation to the vertical position of the support shaft 126.

Bellows 130 also circumscribes the support shaft 126. The bellows 130 may also be coupled to the lift actuator 128 to provide a flexible seal therebetween. The bellows 130 maintains the vacuum integrity of the internal volume 103.

The substrate support 111 is also partially positioned within the processing volume 116. The substrate support 111 is positioned above the purge volume 118. The substrate support 111 includes the first surface 112 facing the chamber lid assembly 108 for receiving the substrate 114. A second surface 113 is opposite the first surface 112 and faces the chamber base 106. During substrate processing, the substrate 114 is secured to the first surface 112 of the substrate support 111 by electrostatic chucking (ESC). The substrate support 111 may include one or more heaters. The substrate support 111 may also include one or more cooling channels (not shown). The substrate support 111 enables control of the temperature of the substrate 114 disposed thereon.

During substrate processing, the processing gas 117 is provided by the showerhead 109 to the internal volume 103. The processing gas 117 is also drawn into the processing volume 116 radially outward from the region above the center of the substrate 114 disposed on the substrate support 111. The processing gas 117 may also be drawn down over the circumferential edge of the first surface 112 of the substrate support 111. In such a case, the processing gas 117 is drawn into an exhaust liner assembly 134 through a first inlet 121 of a first passage 120.

An exhaust liner assembly 134 is disposed in the internal volume 103. The exhaust liner assembly 134 may include a circumferential C-channel shaped section. The exhaust liner assembly 134 is configured to reduce undesirable residue material deposition on the inner walls of the chamber body 102. The exhaust liner assembly 134 facilitates the removal of processing gas 117 from the processing volume 116. The exhaust liner assembly 134 helps to prevent the processing gas 117 in the processing volume 116 from flowing into the purge volume 118. The exhaust liner assembly 134 also prevents a purge gas 119 from flowing into the processing volume 116 from the purge volume 118. The exhaust liner assembly 134 is also configured to reduce residual material deposition on surfaces of chamber components disposed in the purge volume 118.

The exhaust liner assembly 134 includes a liner 136. The liner 136 has an internal space 138. Herein, the liner 136 can be made from a ceramic material, such as aluminum oxide. The liner 136 may also be made from other material that is suitably resistant to heat and corrosion from halogen containing cleaning plasmas, such as $NF_3$ based plasma. The liner 136 can be removed from the processing chamber 100 for scheduled cleaning or replacement.

Purge gas 119 is supplied by a purge gas source 146 in fluid communication with a purge port 144. A purge line 148 couples the purge gas source 146 to the purge port 144. Herein, the purge gas 119 can be delivered to the purge volume 118 during substrate processing or chamber cleaning operations. The purge gas 119 flows into the purge volume 118 through purge port 144. The purge port 144 is disposed through the chamber base 106. The purge port 144 may have a symmetrical cross sectional shape, such as a circular cross sectional shape. In other examples, the purge port 144 may have an asymmetrical cross sectional shape.

The purge gas source 146 supplies the purge gas 119 in the purge volume 118. The purge gas 119 is also drawn into an internal space 138 of the liner 136 through an exhaust conduit 123 fluidly coupled to the first passage 120. The internal space 138 is coupled to an exhaust channel 140. The exhaust channel 140 is coupled to an exhaust port 142. Both the processing gas 117 and purge gas 119 are then drawn from the internal space 138 of the liner 136 through the exhaust channel 140 and evacuated through the exhaust port 142.

Figure 2:
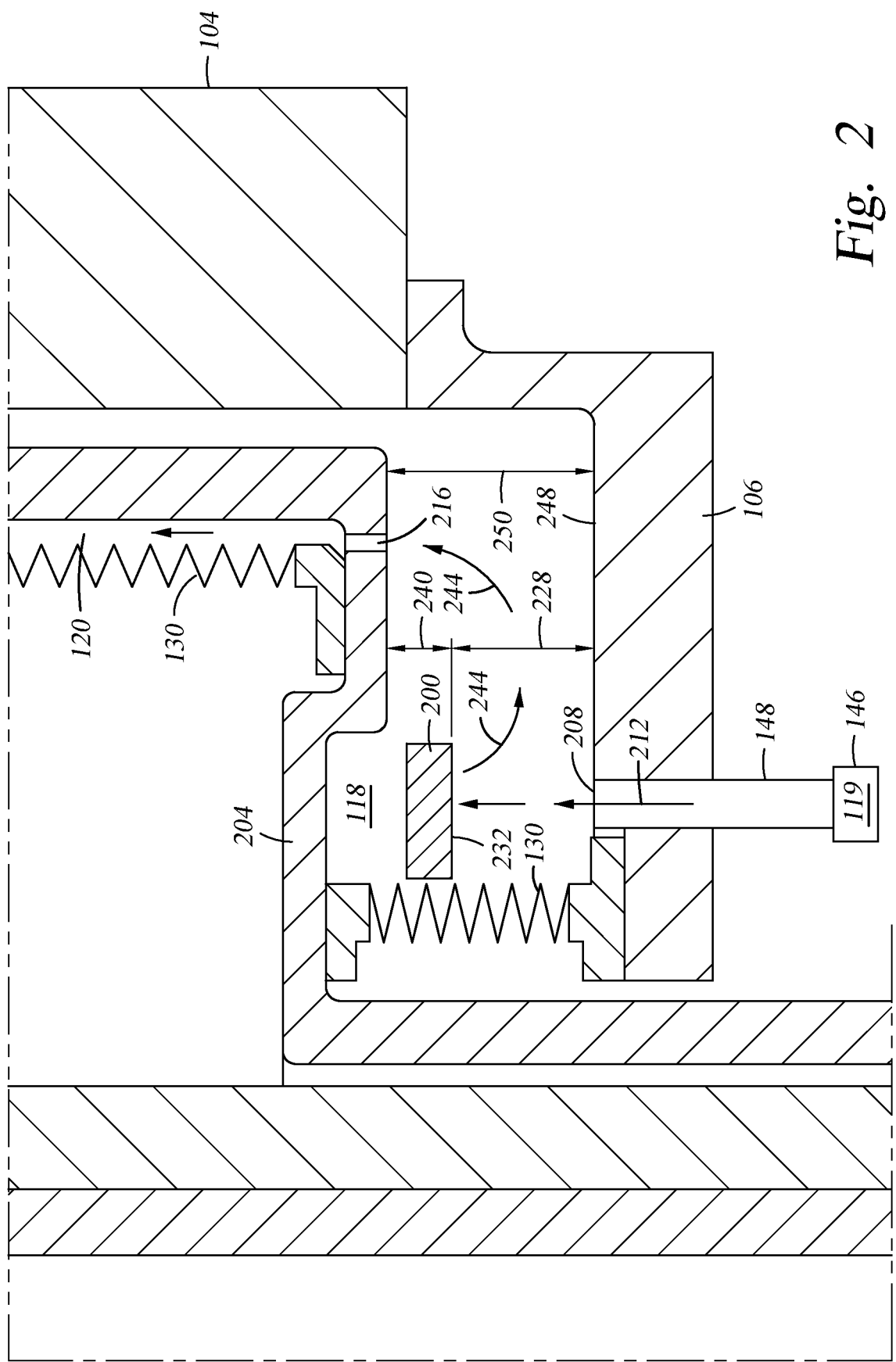
FIG. 2 is a cross-sectional plan view illustrating an example of a baffle disposed in a purge volume of the processing chamber of FIG. 1.

FIG. 2 is a cross-sectional plan view illustrating an example of a baffle 200 disposed in the purge volume 118 of the processing chamber 100 of FIG. 1. The purge volume 118 is defined by bellows 130, the chamber base 106, a bottom bowl 204, and sidewalls 104. The bellows 130 is coupled to the chamber base 106. The bellows 130 is also coupled to the bottom bowl 204. A purge port 208 is disposed within the chamber base 106. The purge gas source 146 supplies the purge gas 119 to the purge volume 118 through the purge port 208. The purge line 148 couples the purge gas source 146 to the purge volume 118 through the purge port 208.

A baffle 200 is positioned above the purge port 208. The baffle 200 can be made of a ceramic, metal, or any other material suitable for an inert gas environment that can be rigidly affixed to the interior surface 248 of the purge volume 118. For example, the baffle 200 can be made of a material containing aluminum, such as aluminum nitride. The baffle 200 can have any geometric shape. A non-limiting example of one geometric shape for the baffle 200 is a quadrilateral geometry having a length of 30 mm, a width of 28 mm, and a thickness of 5 mm. The baffle 200 is positioned at a height 228 above the purge port 208. The height 228 of the baffle 200 may be between 5 mm and 13 mm above the purge port 208. However, these dimensions may be smaller or larger, so long as the baffle 200 is configured to change a trajectory 244 of a jet 212 of a purge gas 119. A vertical distance 240 between the bottom bowl 204 and the bottom surface 232 of the baffle 200 may vary as the bottom bowl 204 moves in a vertical direction. The height 228 and vertical distance 240 are substantially similar to a vertical length 250 between the purge port 208 and an equalizer hole(s) 216. A bottom surface 232 of the baffle 200 is substantially parallel to an interior surface 248 of the chamber base 106.

The equalizer hole 216 is disposed in the bottom bowl 204. The equalizer hole 216 couples the purge volume 118 to the first passage 120. Although a single equalizer hole 216 is illustrated, a series of equalizer holes 216 are radially disposed along the bottom bowl 204. The series of equalizer holes 216 are equidistantly positioned along the bottom bowl 204. A jet 212 of purge gas 119 is generated at the purge port 208 as the purge gas 119 enters the purge volume 118. A velocity of the jet 212 of the purge gas 119 at the purge port 208 can exceed 50 m/s. The baffle 200 restricts the flow of the jet 212 of purge gas 119 traveling into the purge volume 118. The velocity of the jet 212 is reduced significantly in the vicinity above the purge port 208 by the baffle 200.

As such, the velocity of the purge gas 119 dissipates by the time it enters the equalizer hole 216 within the bottom bowl 204. As such, the velocity and energy of the purge gas 119 in an area near the equalizer hole 216 is substantially less than the velocity and energy of the purge gas 119 at the purge port 208. Dissipation of energy occurs when the ability of a fluid having an initial form and an initial energy to do mechanical work is less than the fluid's ability to do mechanical work in the fluid's final form. The jet 212 contacts the bottom surface 232 of the baffle 200. The trajectory 244 of the jet 212 is changed by the baffle 200. A momentum of the jet 212 is reduced when the purge gas 119 contacts the baffle 200, and the baffle 200 changes the trajectory 244 of the jet 212. Correspondingly, a kinetic energy of the purge gas 119 is also reduced. As the momentum of the purge gas 119 is reduced when the gas contacts the baffle 200, the velocity of the purge gas 119 is also reduced. In such a case, the purge gas 119 has less momentum as it travels through the first passage 120.

Referring to FIGS. 1 and 2, when the purge gas 119 traveling through the first passage 120 reaches the first inlet 121, the purge gas 119 creates a backpressure with the processing gas 117 in the processing volume 116. Thus, the processing gas 117 is pressurized in the processing volume 116. Thus, the pressure of the purge gas 119 at the first inlet 121 affects the azimuthal pressure profile of the processing gas 117 across the substrate 114. Accordingly, the azimuthal uniformity of the pressure profile of the processing gas 117 is improved by the baffle 200.

Advantageously, when the baffle 200 is positioned above the purge port 208, the purge gas 219 velocity at the equalizer hole 216 is reduced. As such, the purge gas 119 in the first passage 120 is thus prevented from entering the processing volume 116. The reduced velocity of the purge gas 119 therefore can be used to control the azimuthal plasma profile of the processing gas 117 across the substrate 114. When the baffle 200 is positioned to reduce the velocity jet 212 at the purge port 208, the azimuthal uniformity of the pressure profile of the processing gas 117 on the substrate 114 is greatly improved in the processing volume 116.

Figure 3:
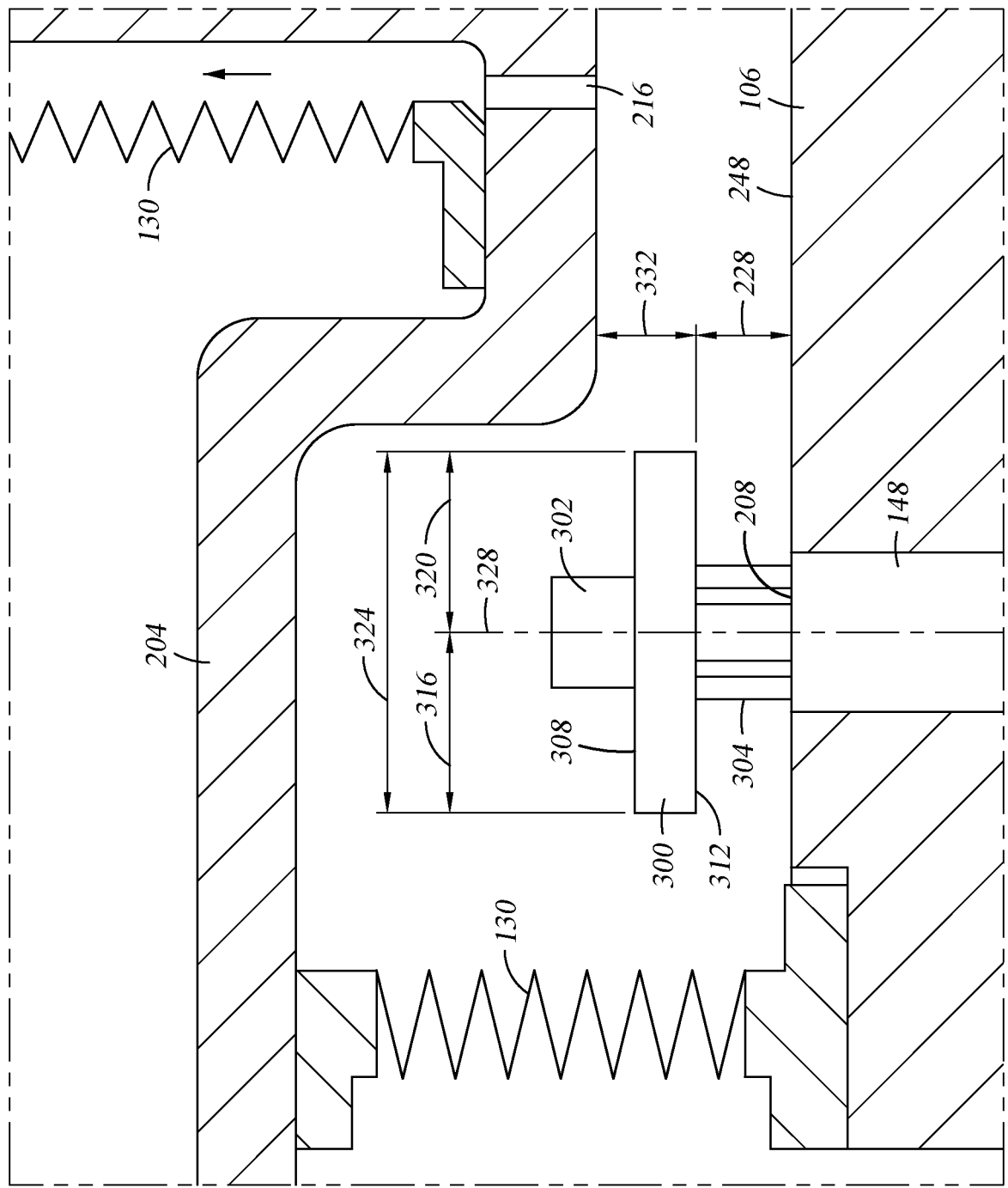
FIG. 3 is a cross-sectional plan view illustrating another example of a baffle disposed in the purge volume of the processing chamber of FIG. 1.

FIG. 3 is a cross-sectional plan view illustrating yet another example baffle 300 disposed in the purge volume 118 of the processing chamber 100 of FIG. 1. The baffle 300 may be supported by legs 304. The legs 304 may extend from a bottom surface 312 of the baffle 300 to the chamber base 106. The legs 304 can be configured to prevent rotation of the baffle 300 or portion thereof. A plurality of fasteners 302 are configured to secure the baffle 300 within the purge volume 118 at the predetermined height 228. The fasteners 302 may be bolts, pins, welded rods, or any other suitable connection device. The fasteners 302 may pass through a top surface 308 of the baffle 300. Alternately, the fasteners 302 may be affixed to the baffle 300 or threaded through the baffle 300. The fasteners 302 are secured to the interior surface 248 of the chamber base 106. For example, the fasteners 302 may be welded, threaded, pinned or attached by other suitable technique to the chamber base 106. Securing the baffle 300 within the purge volume 118 prevents the baffle 300 from dislodging from the chamber base 106. Securing the baffle 300 also helps to prevent undesirable rotation or skew of the baffle 300 due to a force of the purge gas jet 212.

The baffle 300 is positioned above the purge port 208 such that the length 324 of the baffle 300 is bifurcated by a center line 328 of the purge port 208. A first width 316 and a second width 320 may together be substantially equal to the length 324 of the baffle 300. Thus, the first width 316 of the baffle 300 is substantially the same as the second width 320 of the baffle 300. A lower surface 312 of the baffle 300 is substantially parallel to the interior surface 248 of the chamber base 106.

The vertical distance 332 between the equalizer hole 216 and the lower surface 312 of the baffle 300 varies as the position of the bottom bowl 204 moves in a vertical direction as the substrate support 111 is raised and lowered by the lift actuator 128 (shown in FIG. 1). In this example, the lower surface 312 of the baffle 300 is positioned at a vertical distance 332 below the equalizer hole 216. The vertical distance 332 may be between 5 mm and 13 mm.

Figure 4:
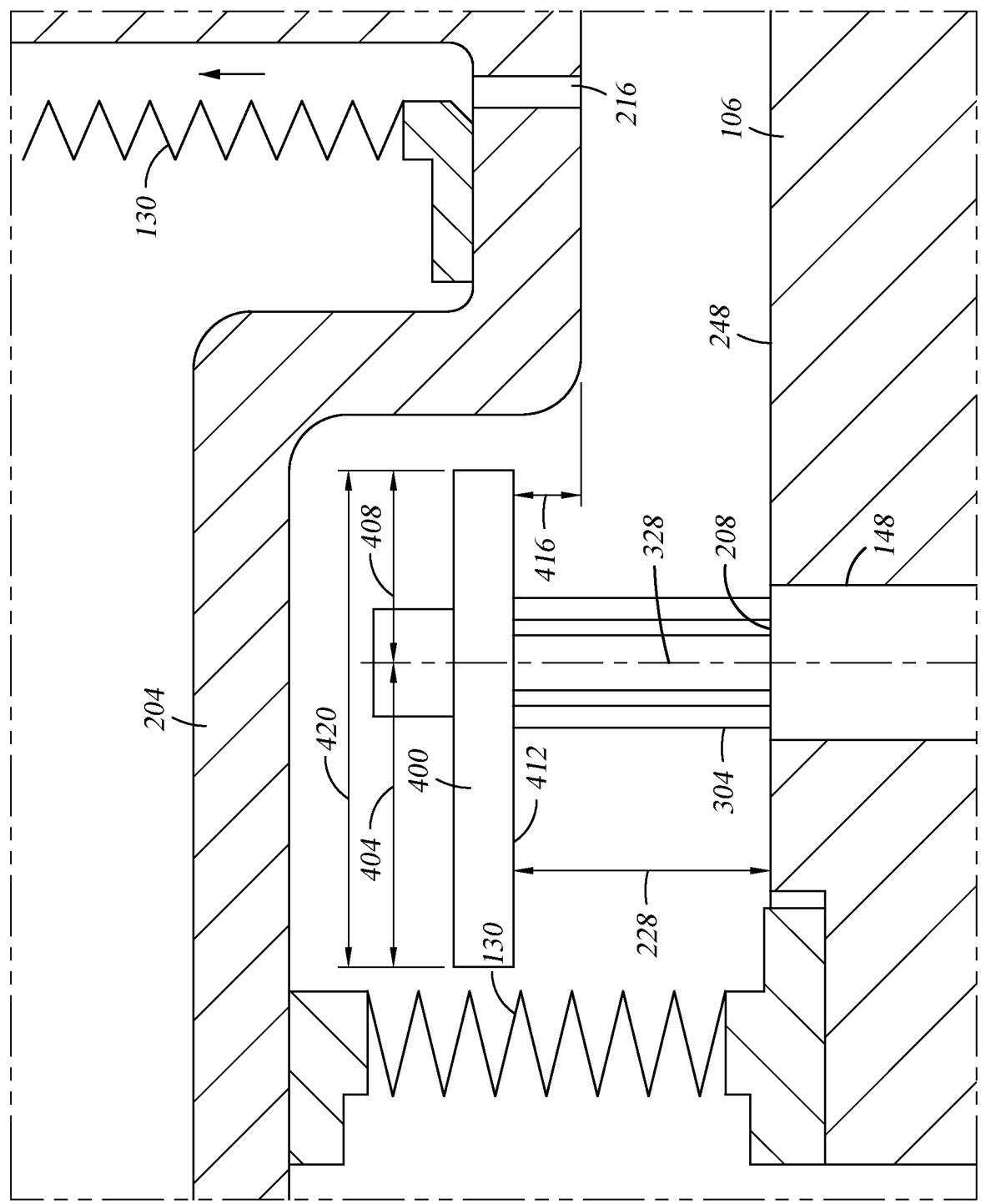
FIG. 4 is a cross-sectional plan view illustrating yet another example of a baffle disposed in the purge volume of the processing chamber of FIG. 1.

FIG. 4 is a cross-sectional plan view illustrating yet another example of the baffle 400 disposed in the purge volume 118 of the processing chamber 100 of FIG. 1. The baffle 400 is also supported by legs 304. The baffle 400 may also be secured to the chamber base 106 by a plurality of fasteners 302. The baffle 400 discussed herein may have a substantially similar dimension as the baffle discussed above with respect to baffle 300. The baffle 400 has a first width 404 and a second width 408. The first width 404 and the second width 408 are together substantially equal to a length 420 of the baffle 400. The first width 404 and the second width 408 are different in width, i.e., are not equal in at least one dimension. In this example, the length 420 of the baffle 400 is not bifurcated by the center line 328 of the purge port 208. The baffle 400 is positioned at the height 228 above the purge port 208 similar to baffle 200 above.

A vertical distance 416 between the equalizer hole 216 and the lower surface 412 of the baffle 400 may vary as the position of the bottom bowl 204 moves in a vertical direction with the raising and lowering of the substrate support 111 (shown in FIG. 1). The lower surface 412 of the baffle 400 is positioned at a vertical distance 416 above the equalizer hole 216. The vertical distance 416 may be between 5 mm and 13 mm. The lower surface 412 of the baffle 400 is substantially parallel to the interior surface 248 of the chamber base 106.

Advantageously, the baffle 400 has an increased surface area, which may further reduce the momentum of the jet 212. Reducing the momentum or velocity of the jet 212 improves the azimuthal pressure profile of the plasma across the substrate in the processing volume 116 (shown in FIG. 1).

Figure 5:
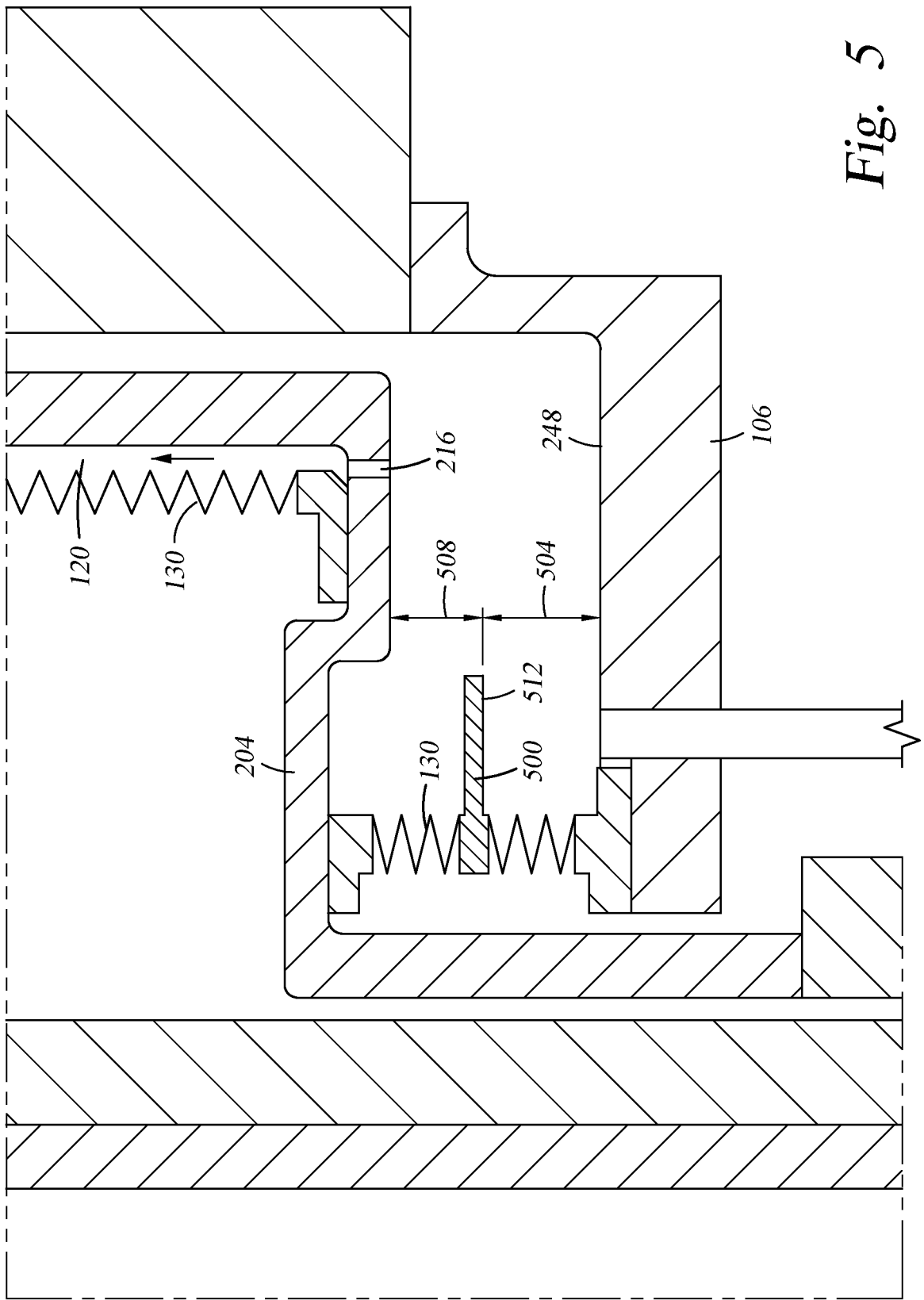
FIG. 5 is a cross-sectional plan view illustrating yet another example of a baffle disposed in the purge volume of the processing chamber of FIG. 1.

FIG. 5 is a cross-sectional plan view illustrating yet another example of the baffle 500 disposed in the purge volume 118 of the processing chamber 100 of FIG. 1. In this example, the baffle 500 is affixed to a portion of the bellows 130. A bottom surface 512 of the baffle 500 is substantially parallel to the interior surface 248 of the chamber base 106. The baffle 500 may be affixed to a portion of the bellows 130 with fasteners 302 or legs 304, or a combination of both (not shown in FIG. 5). The baffle 500 may also be affixed to the bellows utilizing any suitable arrangement that ensures that the baffle 500 remains substantially parallel to the interior surface 248 of the chamber base 106. In this example, the baffle 500 may move vertically in a manner that varies a height 504 of the bottom surface 512 with respect to the interior surface 248 of the chamber base 106 as the substrate support 111 (shown in FIG. 1) is raised and lowered. As the bottom bowl 204 moves in a vertical direction, the bellows 130 also moves. Accordingly, the baffle 500 attached to the bellows 130 also moves. Thus, a vertical distance 508 between the bottom surface 512 of the baffle 500 and the equalizer hole 216 will vary with movement of the substrate support 111. Stated differently, the height 504 of the baffle 500 is configured to change based upon the height of the substrate support 111. As discussed previously, changing the height 504 or the vertical distance 508 affects the average mass flow rate of the purge gas 119 near the equalizer hole 216 by reducing the velocity and redirecting the purge gas entering into the purge volume 118.

Figure 6:
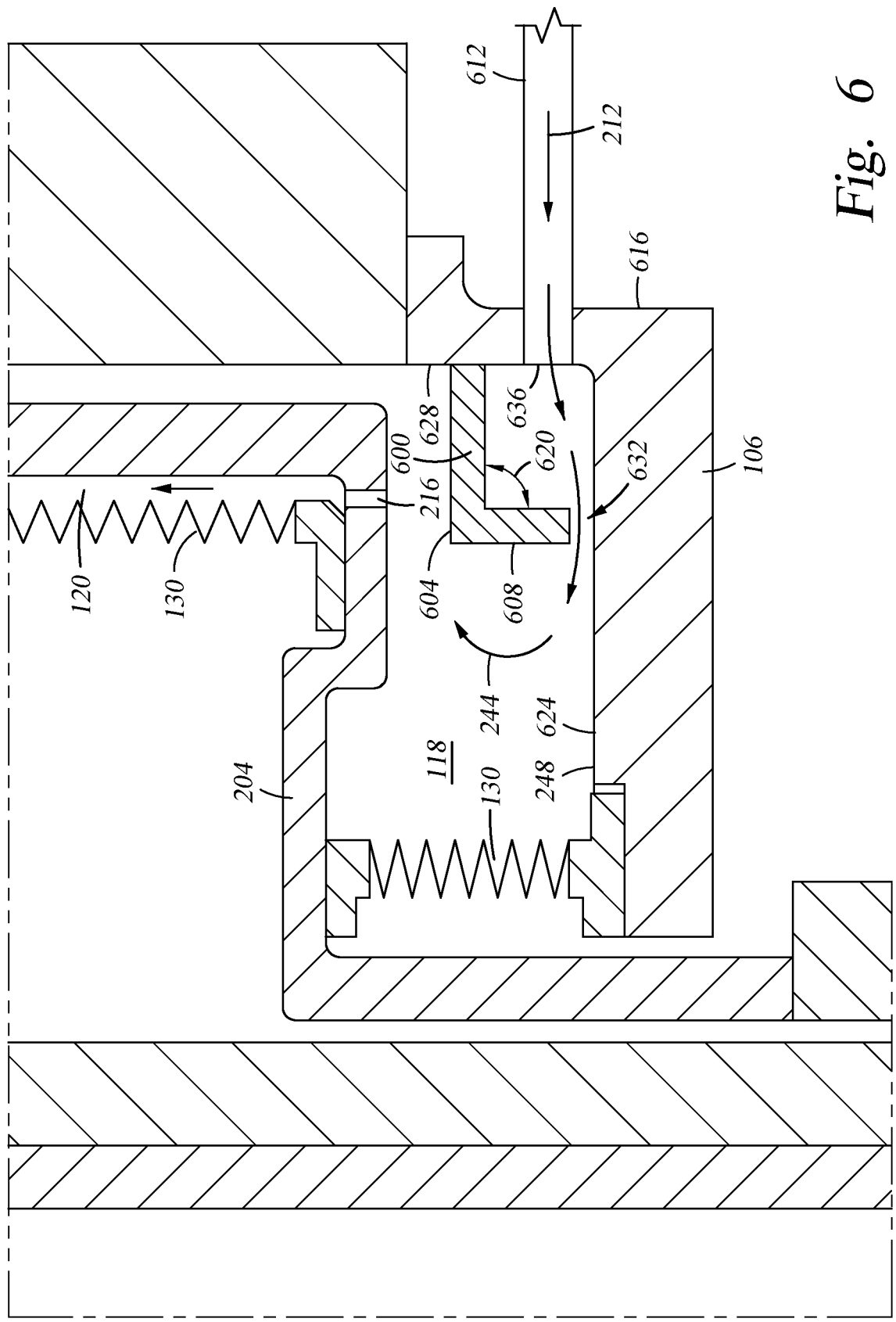
FIG. 6 is a cross-sectional plan view of another configuration for a purge volume of the processing chamber 100 illustrated in FIG. 1.

FIG. 6 is a cross-sectional plan view for another configuration for the purge volume 118 of the processing chamber 100 illustrated in FIG. 1. A baffle 600 depicted in FIG. 6 includes a first leg 604 and a second leg 608. The second leg 608 is coupled to the first leg 604. For example, the first leg 604 may be welded, screwed, bolted, brazed, or glued to the second leg 608. The first leg 604 and second leg 608 may also be uniformly manufactured of a single block of material. A surface of the first leg 604 is substantially parallel to a first interior surface 624. For example, the first interior surface 624 is parallel to a surface of the purge volume 118, such as the interior surface 248 of the chamber base 106. The second leg 608 is substantially parallel to a sidewall 616 of the chamber base 106. An angle 620 is formed between the first leg 604 and the second leg 608. In this example, the angle 620 may range between about 60 degrees and about 120 degrees, such as about 90 degrees.

The baffle 600 may be affixed to a second interior surface 628. For example, the baffle 600 can be affixed to a sidewall in the purge volume 118 such as the chamber base 106. The baffle 600 is affixed to the chamber base 106 utilizing any suitable arrangement that ensures that the first leg 604 remains substantially parallel to the first interior surface 624 of the chamber base 106. In this example, the baffle 600 is also affixed utilizing any suitable arrangement that ensures that the second leg 608 remains substantially parallel to the second interior surface 628 of the chamber base 106.

The baffle 600 is positioned within the purge volume 118 such that a gap 632 exist between the first interior surface 624 of the chamber base 106 and a portion of the baffle 600. A purge line 612 supplies a purge gas 119 to the purge volume 118 via a purge port 636. The jet 212 of purge gas 119 enters the purge volume 118 through the purge port 636 in a sidewall 616 of the chamber base 106. Stated differently, the purge gas enters from the purge port 636 in the side of the purge volume 118, orthogonally from the first interior surface 624 at the bottom of the purge volume 118. The trajectory 244 of the purge gas 119 is altered by contacting the baffle 600. Accordingly, the average mass flow rate of the purge gas 119 at the equalizer hole 216 is reduced with respect to a mass flow rate of the jet 212 at the purge port 636.

Figure 7:
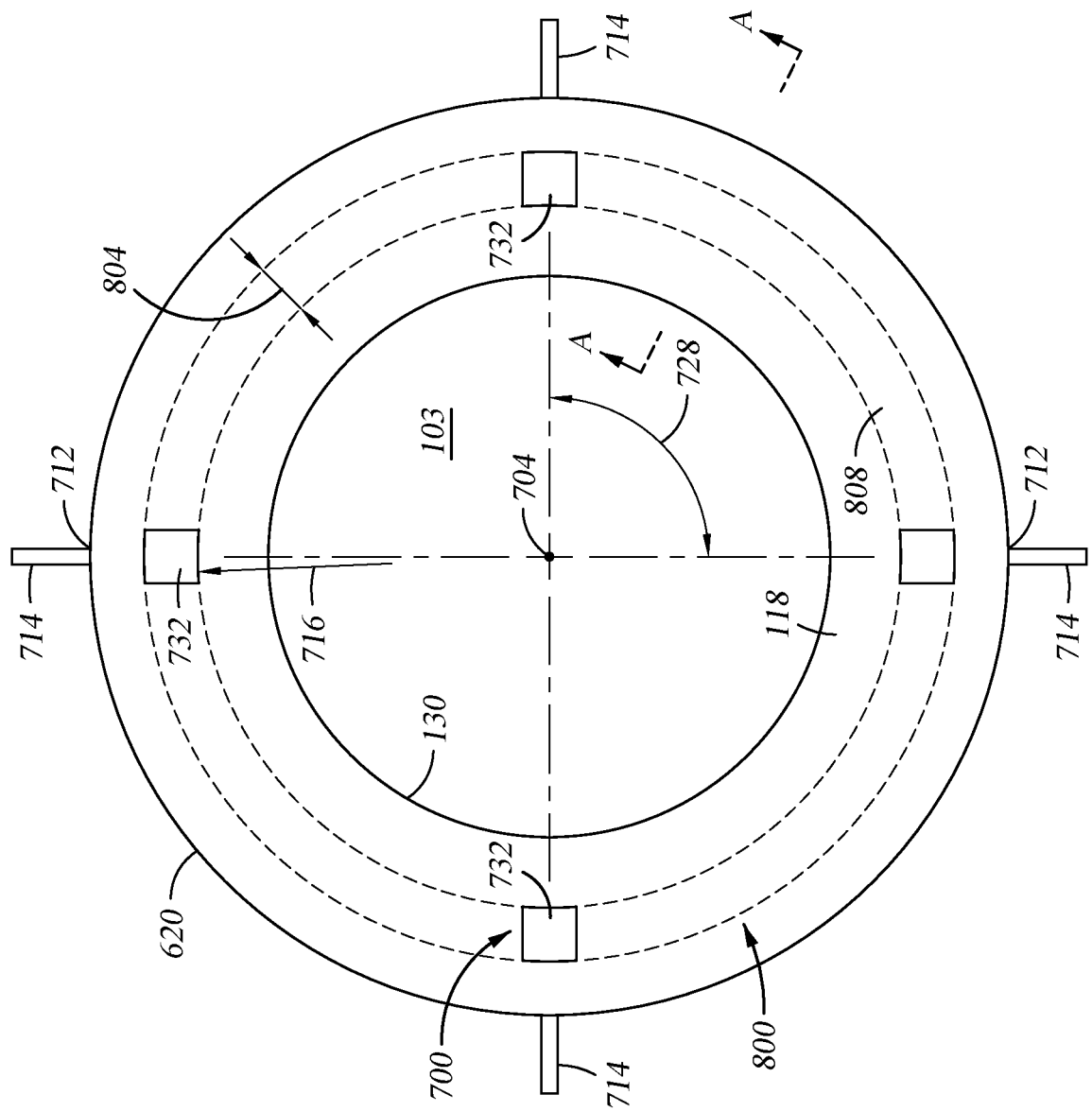
FIG. 7 is a schematic top plan view illustrating a plurality of purge line and baffle locations for the processing chamber of FIG. 1.

FIG. 7 is a top plan view illustrating a plurality of purge lines 714 and baffle locations 700 for the processing chamber 100 of FIG. 1. The baffle locations 700 include multiple baffles 732. Each baffle 732 is disposed adjacent to a purge port 712. Accordingly, there may be two or more purge ports 712, each purge port 712 connected to a purge line 714. Each baffle 732 is configured to disrupt the jet 212 of purge gas 119 as it enters the purge volume 118. Each baffle 732 is positioned at a same distance 716 from a central axis 704 of the internal volume 103. An angle 728 between one of baffles 732 and an adjacent baffle 732 may be the same angle. The angle 728 may also be different. In the example illustrated, there are four baffle locations, each baffle location 700 has a baffle 732. In the illustrated an example, an angle 728 between each baffle 732 is about 90 degrees. In another non-limiting example, the angle between each baffle location 700 may be any angle between about 60 degrees and about 180 degrees, where there is more than one baffle 732. In a manner similar to the other examples, the baffle 732 may be made of a metallic or ceramic material.

Additionally illustrated in FIG. 7 is an alternate circular baffle 800 that is represented by dashed lines. The circular baffle 800 may be utilized in place of the baffles 732. In this example, the circular baffle 800 has a continuous section 808 extended through the purge volume 118. The continuous section 808 is annular in shape or toroidal shaped. The continuous section 808 is arranged within the purge volume 118 so as to be adjacent to each purge port 712.

While the baffle 732 and circular baffle 800 are shown in the same figure, the baffle 732 and the circular baffle 800 are not disposed in the purge volume 118 concurrently. The circular baffle 800 may have a width 804 that is between about 5 mm and about 13 mm. The circular baffle 800 may have a thickness of approximately 5 mm consistent with the baffles 200, 300, 400, 500 described above. Similar to the description of the baffle 300 of FIG. 3, the circular baffle 800 may be supported with legs 304, fastened to a bottom surface of the chamber base 106 with fasteners 302, or a combination of both.

A cross-sectional profile of the circular baffle 800 is taken along line A-A in FIG. 7. The circular baffle 800 may have the same cross-sectional profile as the baffle 300 or the baffle 400. As discussed with respect to baffle 500 illustrated in FIG. 5, the circular baffle 800 may alternately be affixed to the bellows 130. The circular baffle 800 may have the same cross-sectional profile as the baffle 500. As depicted in FIG. 6, the circular baffle 800 may also be affixed to the second interior surface 628 of the chamber base 106. The circular baffle 800 may have the same cross-sectional profile as the baffle 600. The circular baffle 800 may have a first leg 604 and a second leg 608 supporting the circular baffle 800. In a manner similar to the other examples, the circular baffle 800 may be made of a metallic or ceramic material.

Figure 8:
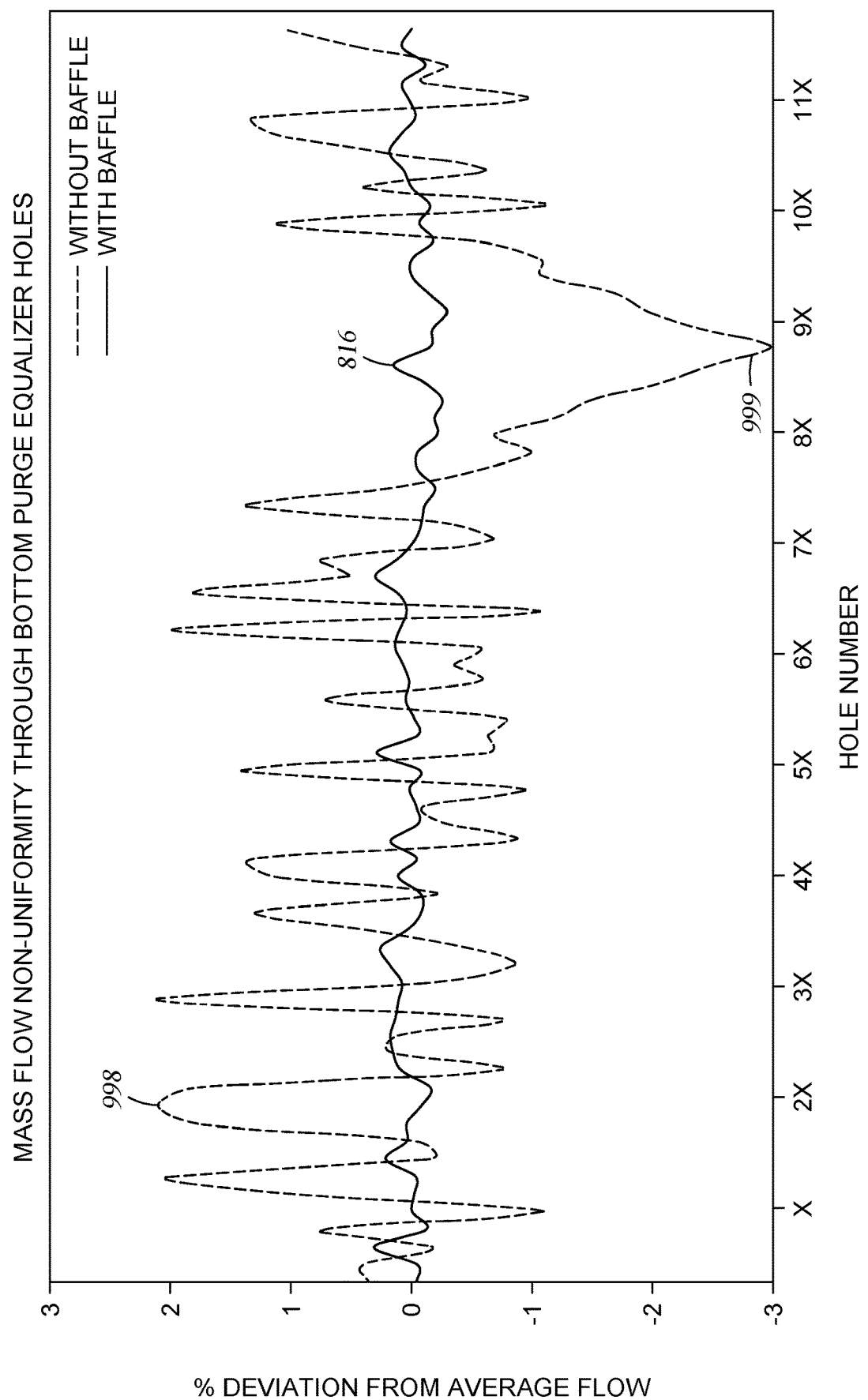
FIG. 8 is a graph of the mass flow rate uniformity depicted at a plurality of equalizer holes.

FIG. 8 is a graph of the mass flow rate uniformity depicted at a plurality of equalizer holes. An average mass flow rate was observed at each equalizer hole 216. In an example illustrated herein, there are more than 70 equalizer holes 216. In this example, a variable x, shown in the identifiers along the x-axis, is a multiplier for the number of holes in the graph and can be greater than 4 and less than 10. For example, for x=4, the identifiers on the x-axis would read 4, 8, 12, 16, etc.

In the conventional system having no baffle 200 disposed in the purge volume 118, the average mass flow rate at the equalizer hole 216 deviates as much as +/−3% with respect to the average mass flow rate taken at the other equalizer holes 216. For example, equalizer holes 999 that are positioned between position 8× and 10× having a standard deviation of about −3% are positioned closest to the purge port 208, when no baffle 200 is present. As a given equalizer hole 216 is radially positioned further away from the purge port 208, the standard deviation of the mass flow rate greatly fluctuates. For equalizer holes 998 that are not in the vicinity of the purge port 208 (e.g. between position x and 4x), the mass flow rate may deviate as much as +/−2%. This fluctuation in the mass flow rate at the plurality of equalizer holes 216 affects the momentum of the purge gas 119 at the first inlet 121 of the processing volume 116. The fluctuation in mass flow rate affects the momentum and therefore the velocity of the purge gas 119 as it enters the processing volume 116. The resulting fluctuation in velocity at the first inlet 121 further disrupts the azimuthal uniformity of the pressure profile of the processing gas 117 on the substrate 114.

Advantageously, the standard deviation of the mass flow rate across each of the equalizer holes 216 is greatly reduced when the baffle, such as baffle 200, is positioned above the purge port 208. When the baffle 200 is disposed within the purge volume 118, the standard deviation of the mass flow rate across each of the plurality of equalizer holes 816 is less than +/−1%. Thus, a first average mass flow rate of the purge gas at a first equalizer hole is within one standard deviation of the average mass flow rate at a second equalizer hole, the first equalizer hole being immediately adjacent to the second equalizer hole. This is an improved decrease of about 60% in the standard deviation for the mass flow rate over conventional systems. Because the average mass flow rate at the equalizer holes 216 is reduced, the purge gas 119 is substantially reduced from entering the processing volume 116 compared to the conventional system where no baffle is present. Thus, the reduction in the velocity of the purge gas 119 entering the first passage 120 contributes to the azimuthal uniformity of the pressure profile of the processing gas 117 on the substrate 114.

Figure 9:
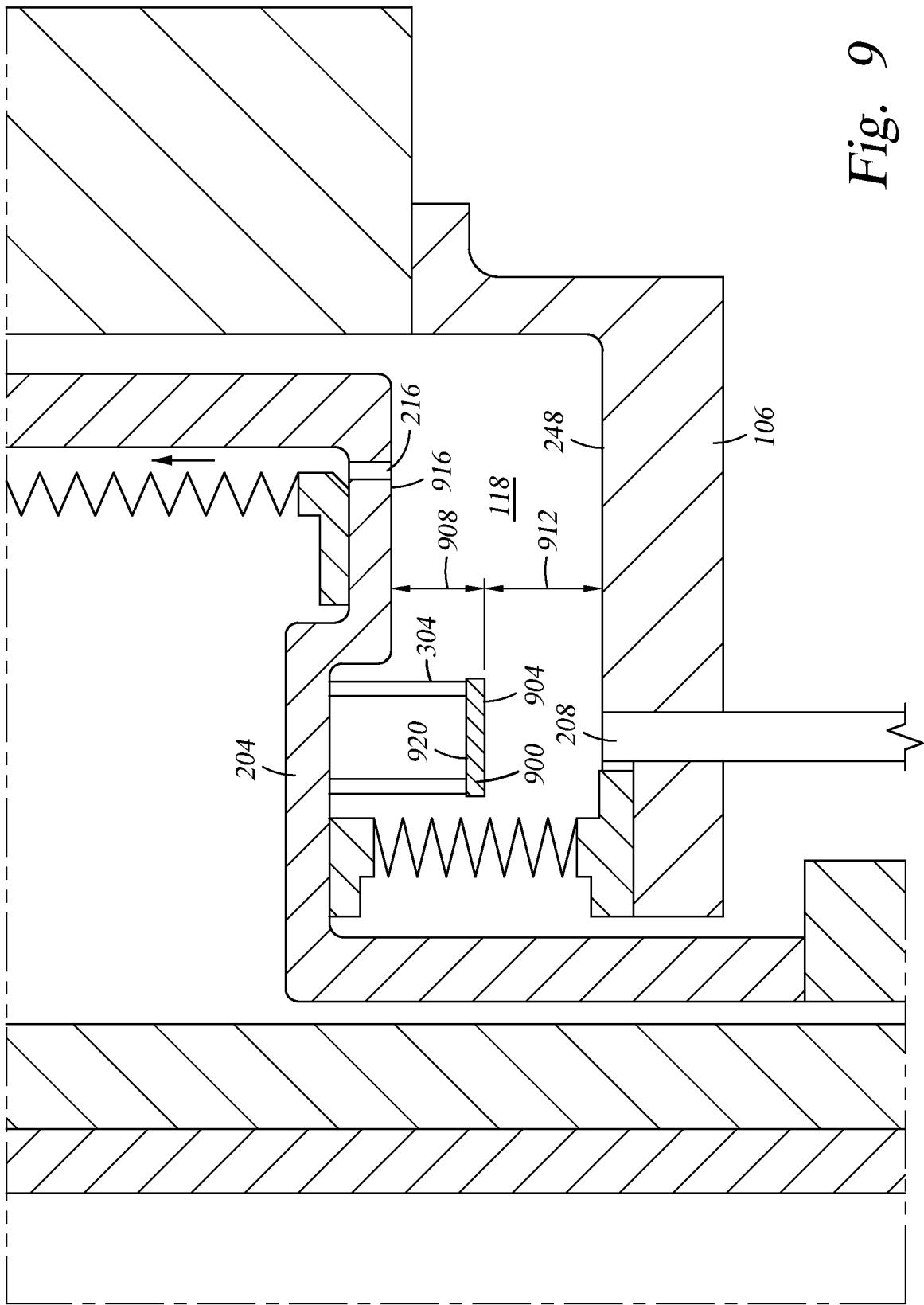
FIG. 9 is a cross-sectional plan view illustrating another example of the baffle disposed in the purge volume of the processing chamber of FIG. 1.

FIG. 9 is a cross-sectional plan view illustrating another example of the baffle disposed in the purge volume 118 of the processing chamber 100 of FIG. 1. A baffle 900 may be supported by legs 304. The legs 304 extend from a bottom surface 920 of the baffle 900 to an interior surface 916 of the bottom bowl 204. The legs 304 can be configured to prevent rotation of the baffle 900 or portion thereof. A plurality of fasteners 302 (shown in FIG. 3) are configured to secure the baffle 900 within the purge volume 118 at a height 912 above the interior surface 248 of the chamber base 106. The baffle 900 is also positioned at substantially the same height 912 above the purge port 208. The height 912 between the interior surface 248 of the chamber base 106 and a top surface 904 of the baffle 900 may vary as the position of the bottom bowl 204 moves in a vertical direction as the substrate support 111 is raised and lowered by the lift actuator 128 (shown in FIG. 1). Legs 304 may be secured with fasteners 302, which may be bolts, pins, welded rods, or any other suitable connection device. The fasteners 302 may pass through the top surface 904 of the baffle 900. Alternately, the fasteners 302 may be affixed to a bottom surface 920 of the baffle 900, or threaded through the baffle 900. The fasteners 302 are secured to the interior surface 916 of the bottom bowl 204. Similarly to the examples discussed above, the fasteners 302 may be welded, threaded, pinned or attached by other suitable technique to the bottom bowl 204.

A vertical distance 908 between the equalizer hole 216 and the top surface 904 of the baffle 900 does not vary as the position of the bottom bowl 204 moves in a vertical direction. The top surface 904 of the baffle 900 is positioned at a vertical distance 908 below the equalizer hole 216. The vertical distance 908 may be adjusted so that the height 912 is between about 5 mm and about 13 mm. The top surface 904 of the baffle 900 is substantially parallel to the interior surface 248 of the chamber base 106.

While the foregoing is directed to specific examples, other examples may be devised without departing from the basic scope thereof, and the scope thereof is determined by the claims that follow.

What we claim is:

1. A processing chamber comprising:
    a lid, sidewalls, and a substrate support collectively defining a processing volume;
    a bottom bowl comprising a first equalizer hole disposed therethrough;
    a chamber base, the chamber base and bottom bowl collectively defining a purge volume disposed beneath the processing volume, the chamber base comprising a purge port couplable to a purge gas line for supplying a purge gas to the purge volume via the purge port;
    a first bellows configured to maintain a vacuum integrity of a portion of an internal volume between the substrate support and the bottom bowl, the first bellows circumscribing a support shaft and coupled to a radially outward edge of the substrate support and the bottom bowl, wherein the internal volume comprises the processing volume and the purge volume;
    a passage positioned above the first equalizer hole, coupled to the processing volume via an inlet, and coupled to the purge volume via the first equalizer hole; and
    a second bellows disposed in the purge volume, wherein the purge volume is defined by the second bellows, the chamber base, the bottom bowl, and the sidewalls;
    a baffle disposed in the purge volume at a height above the purge port, wherein the baffle is configured to deflect a trajectory of the purge gas entering the purge volume.

2. The processing chamber of claim 1, wherein
    the baffle is disposed at a height above the purge port equal to 1 to 3 times a thickness of the baffle.

3. The processing chamber of claim 2, wherein
    the baffle is configured to reduce a velocity of the purge gas at the first equalizer hole to less than between 10 percent to 20 percent of the velocity of the purge gas at the purge port.

4. The processing chamber of claim 1, wherein
    the baffle comprises:
        a first leg positioned substantially parallel to a direction of a purge gas jet;
        a second leg positioned orthogonally to the first leg, wherein the second leg is configured to reduce a velocity of the purge gas jet.

5. The processing chamber of claim 1, wherein,
    a first average mass flow rate of the purge gas at the first equalizer hole is within one standard deviation of a second average mass flow rate at a second equalizer hole disposed in the bottom bowl, the first equalizer hole being immediately adjacent to the second equalizer hole.

6. The processing chamber of claim 5, wherein,
    a third average mass flow rate of the purge gas at a third equalizer hole disposed in the bottom bowl is within one standard deviation of the second average mass flow rate at the second equalizer hole, and within one standard deviation of the first average mass flow rate at the first equalizer hole, the first equalizer hole being immediately adjacent to the second equalizer hole, and the second equalizer hole being immediately adjacent to the third equalizer hole.

7. A processing chamber comprising:
    a lid, sidewalls, and a substrate support collectively defining a processing volume;
    a bottom bowl comprising a first equalizer hole disposed therethrough;
    a chamber base, the chamber base and bottom bowl collectively defining a purge volume disposed beneath the processing volume, the chamber base comprising a purge port couplable to a purge gas line for supplying a purge gas to the purge volume via the purge port;
    a bellows configured to maintain a vacuum integrity of a portion of an internal volume between the substrate support and the bottom bowl, the bellows circumscribing a support shaft to define a passage and coupled to the radially outward edge of the substrate support, wherein the passage is radially surrounding the bellows, and wherein the internal volume comprises the processing volume and the purge volume;
    the passage positioned above the first equalizer hole, coupled to the processing volume via an inlet, and coupled to the purge volume via the first equalizer hole, and wherein the chamber base has a second purge port couplable to a second purge gas line for supplying the purge gas to the purge volume via the second purge port;
    a baffle disposed in the purge volume at a height above the first purge port and the second purge port.

8. The processing chamber of claim 7, wherein
    the baffle is disposed at a height above the first purge port or the second purge port equal to 1 to 3 times a thickness of the baffle.

9. The processing chamber of claim 8, wherein
    the baffle is configured to reduce a velocity of the purge gas at the first equalizer hole to less than between 10 percent to 20 percent of the velocity of the purge gas at the first purge port or the second purge port.

10. The processing chamber of claim 7, wherein
    the baffle comprises:
        a first leg positioned substantially parallel to a direction of a purge gas jet;
        a second leg positioned orthogonally to the first leg, wherein the second leg is configured to reduce a velocity of the purge gas jet.

11. The processing chamber of claim 7, wherein
    the baffle is configured to reduce a velocity of the purge gas at the first equalizer hole to less than 20 percent of the velocity of a purge gas jet at the first purge port or the second purge port.

12. The processing chamber of claim 7, wherein,
    a first average mass flow rate of the purge gas at the first equalizer hole is within one standard deviation of a second average mass flow rate at a second equalizer hole disposed in the bottom bowl, the first equalizer hole being immediately adjacent to the second equalizer hole.

13. The processing chamber of claim 12, wherein,
a third average mass flow rate of the purge gas at a third equalizer hole disposed in the bottom bowl is within one standard deviation of the second average mass flow rate at the second equalizer hole, and within one standard deviation of the first average mass flow rate at the first equalizer hole, the first equalizer hole being immediately adjacent to the second equalizer hole, and the second equalizer hole being immediately adjacent to the third equalizer hole.

14. A processing chamber comprising:
a lid, sidewalls, and a substrate support collectively defining a processing volume;
a bottom bowl comprising a first equalizer hole disposed therethrough;
a chamber base, the chamber base and bottom bowl collectively defining a purge volume disposed beneath the processing volume, the chamber base comprising a purge port couplable to a purge gas line for supplying a purge gas to the purge volume via the purge port;
a first bellows configured to maintain a vacuum integrity of a portion of an internal volume between the substrate support and the bottom bowl, the first bellows circumscribing a support shaft to define a passage and coupled to the radially outward edge of the substrate support, wherein the passage is radially surrounding the first bellows, and wherein the internal volume comprises the processing volume and the purge volume;
the passage positioned above the first equalizer hole, coupled to the processing volume via an inlet, and coupled to the purge volume via the first equalizer hole; and
a second bellows disposed in the purge volume, wherein the purge volume is defined by the second bellows, the chamber base, the bottom bowl, and the sidewalls;
a baffle disposed in the purge volume at a height above the purge port, wherein the baffle is configured to deflect a trajectory of the purge gas entering the purge volume; wherein the baffle is configured to reduce a velocity of the purge gas at the first equalizer hole to less than 20 percent of the velocity of a purge gas jet at the purge port.

* * * * *